United States Patent
Poplevine et al.

(10) Patent No.: US 8,159,877 B2
(45) Date of Patent: Apr. 17, 2012

(54) METHOD OF DIRECTLY READING OUTPUT VOLTAGE TO DETERMINE DATA STORED IN A NON-VOLATILE MEMORY CELL

(75) Inventors: Pavel Poplevine, Burlingame, CA (US); Ernes Ho, Sunnyvale, CA (US); Umer Khan, Santa Clara, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 98 days.

(21) Appl. No.: 12/731,589

(22) Filed: Mar. 25, 2010

(65) Prior Publication Data

US 2011/0235425 A1  Sep. 29, 2011

(51) Int. Cl.
G11C 11/34 (2006.01)
G11C 16/04 (2006.01)

(52) U.S. Cl. ........... 365/185.1; 365/185.05; 365/185.18; 365/185.28

(58) Field of Classification Search ............. 365/185.05, 365/185.1, 185.18, 185.28
See application file for complete search history.

(56) References Cited

U.S. PATENT DOCUMENTS

| | | | | | |
|---|---|---|---|---|---|
| 4,885,719 | A | * | 12/1989 | Brahmbhatt | 365/185.17 |
| 5,272,368 | A | * | 12/1993 | Turner et al. | 365/185.1 |
| 5,404,328 | A | * | 4/1995 | Takemae | 365/185.1 |
| 5,587,945 | A | * | 12/1996 | Lin et al. | 365/185.1 |
| 5,594,687 | A | * | 1/1997 | Lin et al. | 365/185.1 |
| 5,615,150 | A | * | 3/1997 | Lin et al. | 365/185.17 |
| 5,754,471 | A | * | 5/1998 | Peng et al. | 365/185.1 |
| 6,028,789 | A | * | 2/2000 | Mehta et al. | 365/185.14 |
| 6,137,723 | A | | 10/2000 | Bergemont et al. | 365/185.18 |
| 6,611,463 | B1 | * | 8/2003 | Mehta et al. | 365/185.28 |
| 6,903,978 | B1 | | 6/2005 | Mirgorodski et al. | 365/185.28 |
| 6,992,927 | B1 | | 1/2006 | Poplevine et al. | 365/185.05 |
| 7,049,872 | B2 | * | 5/2006 | Diorio et al. | 327/276 |
| 7,164,606 | B1 | | 1/2007 | Poplevine et al. | 365/185.28 |
| 7,301,811 | B1 | * | 11/2007 | Paak | 365/185.1 |
| 7,679,957 | B2 | * | 3/2010 | Ma et al. | 365/185.09 |
| 7,791,950 | B2 | * | 9/2010 | Wang et al. | 365/185.28 |
| 2004/0052113 | A1 | * | 3/2004 | Diorio et al. | 365/185.21 |
| 2006/0209598 | A1 | * | 9/2006 | Wang et al. | 365/185.28 |

* cited by examiner

*Primary Examiner* — J. H. Hur
(74) *Attorney, Agent, or Firm* — Dergosits & Noah LLP

(57) ABSTRACT

An NVM cell design enables direct reading of cell output voltage to determine data stored in the cell, while providing low current consumption and a simple program sequence that utilizes reverse Fowler-Nordheim tunneling.

3 Claims, 2 Drawing Sheets

METHOD OF DIRECTLY READING OUTPUT VOLTAGE TO DETERMINE DATA STORED IN A NON-VOLATILE MEMORY CELL

FIELD OF THE INVENTION

The present invention relates to integrated circuit memory devices and, in particular, to a method of directly reading output voltage to determine data stored in a non-volatile memory (NVM) cell.

BACKGROUND OF THE INVENTION

U.S. Pat. No. 7,164,606 B1, which issued on Jan. 16, 2007, to Poplevine et al., discloses an all PMOS 4-transistor non-volatile memory (NVM) cell that utilizes reverse Fowler-Nordheim tunneling for programming.

Referring to FIG. 1, as disclosed in U.S. Pat. No. 7,164,606, in accordance with the method of programming an NVM array that includes all-PMOS 4-transistor NVM cells having commonly-connected floating gates, for each cell 100 in the array that is to be programmed, all of the electrodes of the cell are grounded. Then, an inhibiting voltage $V_N$ is applied to the bulk-connected source region $V_r$ of the cell's read transistor $P_r$, to the commonly-connected drain, bulk and source regions $V_e$ of the cell's erase transistor $P_e$, and to the drain region $D_r$ of the read transistor $P_r$. The source region $V_p$ and the drain region $D_p$ of the cell's programming transistor $P_w$ are grounded. The bulk $V_{nw}$ of the programming transistor $P_w$ is optional; it can be grounded or it can remain at the inhibiting voltage $V_N$. For all cells in the NVM array that are not selected for programming, the inhibiting voltage $V_N$ is applied to the $V_r$, $V_e$ and $D_r$ electrodes and is also applied to the $V_p$, $D_p$ and $V_{nw}$ electrodes. The control gate voltage $V_c$ of the cell's control transistor $P_c$ is then swept from 0V to a maximum programming voltage $V_{cmax}$ in a programming time $T_{prog}$. The control gate voltage $V_c$ is then ramped down from the maximum programming voltage $V_{cmax}$ to 0V. All electrodes of the cell and the inhibiting voltage $V_N$ are then returned to ground.

As described in detail in the '606 patent, the all-PMOS 4-transistor NVM cell disclosed therein relies on reverse Fowler-Nordheim tunneling for programming. That is, when the potential difference between the floating gate electrode of the programming transistor of the all-PMOS NVM cell and the drain, source and bulk region electrodes of the programming transistor exceeds a tunneling threshold voltage, electrons tunnel from the drain and source electrodes to the floating gate, making the floating gate negatively charged.

U.S. Pat. No. 7,164,606 is hereby incorporated by reference herein in its entirety to provide background information regarding the present invention.

The all-PMOS 4-transistor NVM cell programming technique disclosed in the '606 patent provides advantages of both low current consumption, allowing the ability to simultaneously program a large number of cells without the need for high current power sources, and a simple program sequence. To read data from the all-PMOS NVM cell 100, output current is sensed and compared either to a reference current or by using a differential cell structure. In addition, to translate the sensed current into a data output, a sense amplifier and latching circuit are usually required. The sense amplifier transforms the sensed current to a corresponding voltage level. The latching circuit stores the data output, since the sense amplifier is usually turned off after the cell's read cycle. Use of the sense amplifier circuit and the latching circuit adds significantly to the total area of the NVM cell array.

Thus, there is a need for an NVM cell of reduced size compared with that of the all-PMOS NVM cell, but that retains its advantages.

SUMMARY OF THE INVENTION

In accordance with an embodiment of the present invention, a non-volatile memory (NVM) cell includes an NMOS control transistor having commonly-connected source, drain and bulk regions to which a control voltage is applied; the gate of the control transistor is connected to a data storage node. The NVM cell also includes a PMOS erase transistor having commonly-connected source, drain and bulk regions to which an erase voltage is applied; the gate of the erase transistor is connected to the data storage node. The NVM cell also includes two transistors that act like an inverter circuit. A PMOS inverter transistor and an NMOS inverter transistor each have a drain that is connected to an output voltage node of the NVM cell. The NVM cell includes additional circuitry for delivering either a first supply voltage or a second lower supply voltage to the cell. A first NMOS transistor includes commonly-connected source and bulk regions that are grounded and a drain that is connected to the source of the PMOS inverter transistor. A first PMOS transistor has its commonly-connected source and bulk regions selectively connectable to receive the first supply voltage or the second supply voltage and a drain that is connected to the source of the PMOS inverter transistor. The gates of the first NMOS and PMOS transistors are both connected a first electrode. A second NMOS transistor includes commonly-connected source and bulk regions that are grounded and a drain that is connected to the source of the NMOS inverter transistor. A second PMOS transistor has its commonly-connected source and bulk regions selectively connectable to receive either the first supply voltage or the second supply voltage and its drain connected to the source of the NMOS inverter transistor. The gates of the second NMOS and PMOS transistors are both connected to a second electrode.

In a read condition for the above-described NVM cell, the supply voltage is set to the second lower supply voltage. The first electrode is set to 0V, thus setting the source of the PMOS inverter transistor to the second supply voltage. The second electrode is set to the second supply voltage, thus setting the source of the NMOS inverter transistor to 0V. All other electrodes of the NVM cell are set to 0V. Under this read condition, the output data of the NVM cell may be read on the cell's output voltage node.

The features and advantages of the various aspects of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 1:
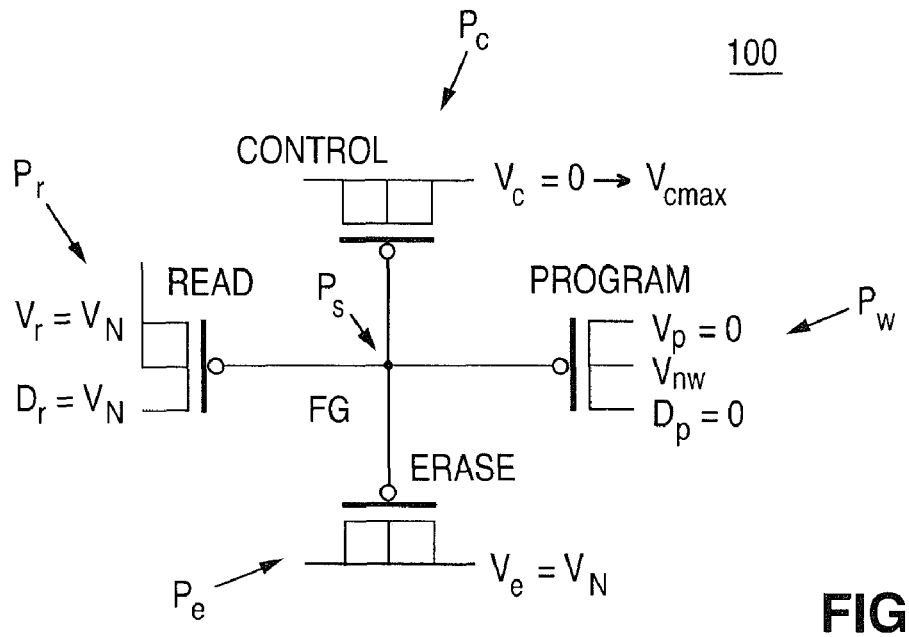
FIG. 1 is a schematic diagram illustrating an all-PMOS 4-transistor NVM cell.
Figure 2:
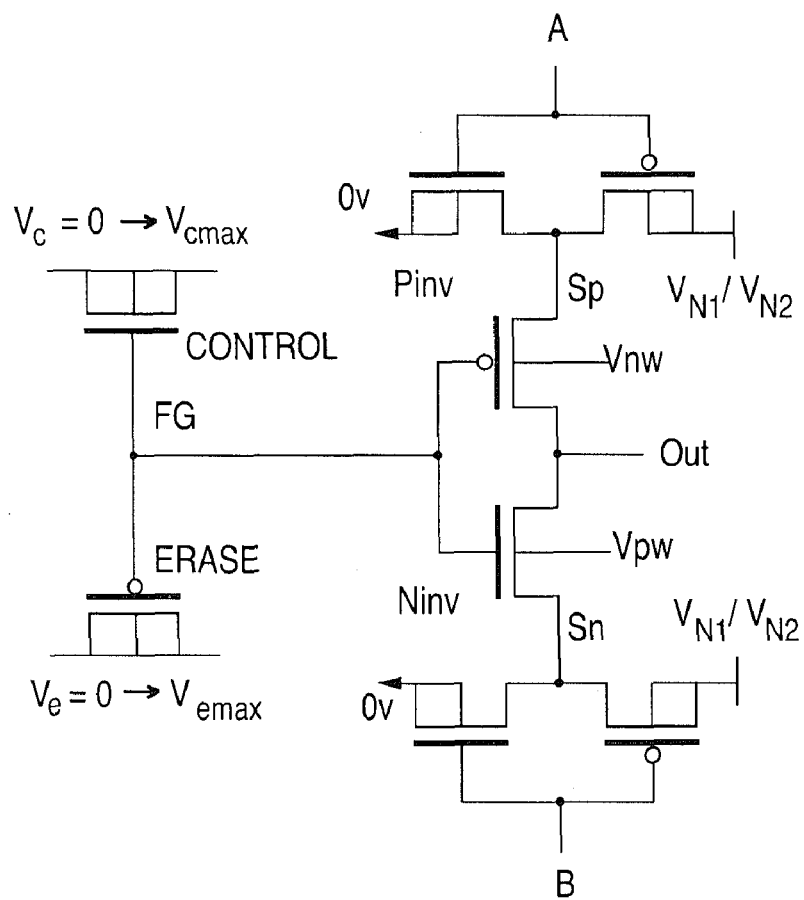
FIG. 2 is a schematic diagram illustrating an embodiment of an NVM cell in accordance with the concepts of the present invention.

FIG. 2 shows an NVM cell 200 that enables the direct read of output voltage to determine data stored in the cell 200, while maintaining the simple program sequence and low current consumption advantages of the FIG. 1 all-PMOS 4-transistor NVM cell 100.

As shown in FIG. 2, the NVM cell 200 includes an NMOS control transistor $N_c$ having commonly-connected source, drain and bulk region electrodes to which a control voltage $V_c$ is applied; the gate electrode of the control transistor $N_c$ is connected to a data storage node $N_s$. The cell 200 also includes a PMOS erase transistor $P_e$ having commonly-connected source, drain and bulk region electrodes to which an erase voltage $V_e$ is applied; the gate electrode of the erase transistor $V_e$ is connected to the data storage node $N_s$.

The NVM cell 200 also includes two transistors, PMOS inverter transistor $P_{inv}$ and NMOS inverter transistor $N_{inv}$, that, as discussed in greater detail below, act like an inverter circuit. PMOS inverter transistor $P_{inv}$ includes a source electrode $S_p$, a bulk region electrode $V_{nw}$ and a drain electrode connected to the cell's voltage output node Out. NMOS inverter transistor $N_{inv}$ includes a source electrode $S_n$, a bulk region electrode $V_{pw}$ and a drain electrode connected to the voltage output node Out of the NVM cell 200.

The NVM cell 200 includes additional circuitry for delivering either a first supply voltage $V_{N1}$ or a second lower supply voltage $V_{N2}$ to the cell 200, as discussed in greater detail below. A first NMOS transistor 202 includes commonly-connected source and bulk region electrodes that are grounded and a drain electrode that is connected to the source electrode $S_p$ of PMOS transistor $P_{inv}$. A first PMOS transistor 204 has its commonly-connected source and bulk region electrodes selectively connectable to receive either the first supply voltage $V_{N1}$ or the second lower supply voltage $V_{N2}$ and its drain electrode connected to the source electrode $S_p$ of PMOS transistor $P_{inv}$. The gate electrode of the first NMOS transistor 202 and the gate electrode of the first PMOS transistor 204 are both connected to electrode A. A second NMOS transistor 206 includes commonly-connected source and bulk region electrodes that are grounded and a drain electrode that is connected to the source electrode $S_n$ of NMOS transistor $N_{inv}$. A second PMOS transistor 208 has its commonly-connected source electrode and bulk region electrode selectively connectable to receive either the first supply voltage $V_{N1}$ or the second lower supply voltage $V_{N2}$ and its drain electrode connected to the source electrode $S_n$ of the of NMOS transistor $N_{inv}$. The gate electrode of the second NMOS transistor 206 and the gate electrode of the second PMOS transistor 208 are both connected to electrode B.

Figure 3:
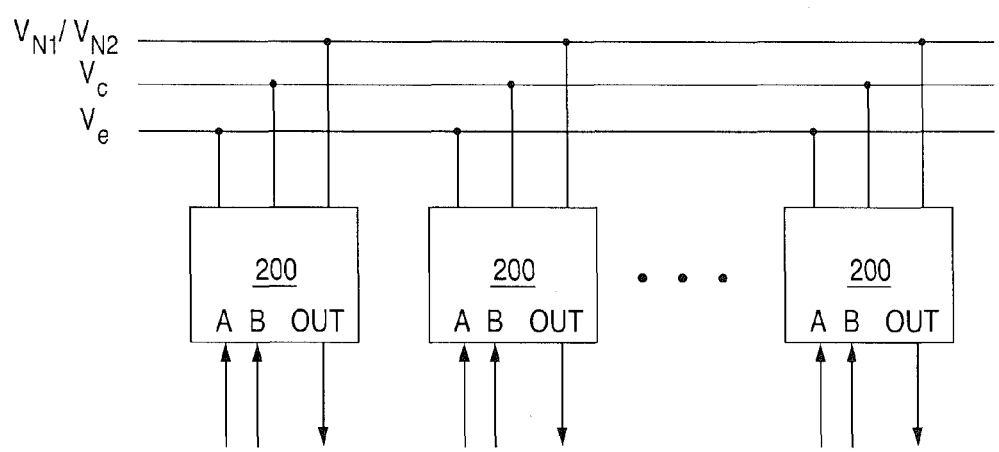
FIG. 3 is a schematic diagram illustrating an embodiment of an NVM cell array row that includes a plurality of NVM cells of the type shown in FIG. 2.

FIG. 3 shows an embodiment of an NVM cell array row 300 that includes a plurality of NVM cells of the type shown in FIG. 2.

As stated above, the NVM cell 200 shown in FIG. 2 changes the structure of the all-PMOS 4-transistor NVM cell 100 shown in FIG. 1 by adding circuitry that directly translates the data stored in the NVM cell 200 into rail-to-rail output voltage. As shown in FIG. 2, this is realized by using by using two different supply voltage levels, where supply voltage level $V_{N1}$, which is used during the erase and programming sequences is higher than supply voltage level $V_{N2}$, which is used during a read sequence. After a program sequence, which utilizes the same reverse Fowler-Nordheim tunneling method described in the above-cited '606 patent, the difference in the voltage level between the floating gate of a programmed NVM cell 200 and the floating gate of a non-programmed NVM cell 200 is about $V_{N1}$. Then, during a read sequence, the $P_{inv}$ transistor and the $N_{inv}$ transistor act like an inverter circuit, at power supply level $V_{N2}$ and ground level 0V, with input connected to the floating gate of the NVM cell that has a voltage level that is either turning off the $P_{inv}$ transistor completely (while turning on the $N_{inv}$ transistor) or turning off the $N_{inv}$ transistor completely (while turning on the $P_{inv}$ transistor). This can be done by adjusting the maximum erase voltage $V_{emax}$ and the maximum control voltage $V_{cmax}$ (which are used during the erase sequence and the programming sequence, respectively) to shift the voltage of the floating gate of a programmed NVM cell 200 and the floating gate of a non-programmed NVM cell 200 by the same amount up or down, since the voltage difference $V_{N1}$ is larger than the voltage difference $V_{N2}$. This condition results in the voltage output electrode Out of the NVM cell 200 being driven to either $V_{N2}$ or 0V, thus producing rail-to-rail voltage output. The $N_{inv}$ transistor is an NMOS device with its substrate region ($V_{pw}$ electrode) realized using either a common P-substrate (tied to 0V) or isolated P-wells tied to its source region ($S_n$ electrode); the $P_{inv}$ transistor is a PMOS device with its substrate region ($V_{nw}$ electrode) realized using either $V_{N1}/V_{N2}$ (common N-well) or isolated N-wells tied to its source region ($S_p$ electrode).

The FIG. 2 NVM cell 200 eliminates the need to have a sense amplifier circuit or a latching circuit as part of the output circuitry of the cell. It also eliminates the need to have a reference current for comparison, which is usually generated by reference cells or by using a differential cell structure, both of which significantly increase the total area of the NVM cell array row. Thus, the FIG. 2 cell 200 simplifies the overall circuit design and reduces the size of the array row, as compared with the FIG. 1 all-PMOS NVM cell 100. At the same time, the FIG. 2 cell 200 retains the advantages of the FIG. 1 cell 100 by using the same method of programming and erasing using Fowler-Nordheim tunneling. As discussed in greater detail below, The program sequence and erase sequence are only slightly different, while the read sequence is significantly simplified (the data output is readily available from the cell NVM 200 on idle state).

Referring to FIGS. 2 and 3, a summary of the program, erase and read sequences for the FIG. 2 NVM cell 200 in an array row 300 is as follows:

Program Sequence

Setting all electrodes to 0V, with the supply voltage set to $V_{N1}$. For all NVM cells to be programmed, setting the A electrode and the B electrode to voltage $V_{N1}$, thus setting all $S_p$, $S_n$ and Out electrodes for selected cells to voltage 0V. For all cells selected to not be programmed, setting the A electrode and the B electrode to 0V, thus setting all $S_p$, $S_n$ and Out electrodes of non-selected cells to voltage $V_{N1}$. Ramping up the control voltage $V_c$ from 0V to a predefined maximum control voltage $V_{cmax}$ for a preselected programming time $T_{prog}$ while ramping up the erase voltage $V_e$ from 0V to a predefined maximum erase voltage $V_{emax}$ for the programming time $T_{prog}$; the $V_e$ electrode is ramped up along with the $V_c$ electrode to prevent forward biasing the diode that is formed between the isolated P-well and the N-well. Ramping down the $V_c$ electrode from $V_{cmax}$ to 0V and the $V_e$ electrode from $V_{emax}$ to 0V. Returning all electrodes with voltage $V_{N1}$ to 0V, thus completing the program sequence.

Erase Sequence

Setting all electrodes to 0V, with the supply voltage set to $V_{N1}$. Setting the A electrodes and the B electrodes to voltage $V_{N1}$, thus setting all $S_p$, $S_n$ and Out electrodes to voltage 0V. ramping up the erase voltage $V_e$ from 0V to the maximum erase voltage $V_{emax}$ for the duration of a preselected erase time $T_{erase}$. At the end of the erase time $T_{erase}$, ramping down the erase voltage $V_e$ from the maximum erase voltage $V_{emax}$ to 0V. Returning all electrodes with voltage $V_{N1}$ to 0V, thus completing the erase sequence.

Read Condition

While the supply voltage is set to $V_{N2}$, setting the A electrode to voltage 0V, thus setting the $S_p$ electrode to voltage $V_{N2}$, setting the B electrode to voltage $V_{N2}$, thus setting the $S_n$ electrode to 0V, and setting all other electrodes to 0V. Under this read condition, the output data of the cell 200 is on the cell's Out electrode. (It is note that, since the NVM cell in its virgin state has an unknown floating gate voltage level, both the A electrode and the B electrode should be set to voltage $V_{N1}$ to prevent short current from flowing through the $P_{inv}$ and $N_{inv}$ transistors.

Those skilled in the art will appreciate that the voltage levels utilized in the program, erase and read operations will depend upon the thickness of the gate oxide utilized in the NMOS and PMOS devices of the NVM cell. For example, for agate oxide thickness of 60-80 Å, $V_{N1} \sim = 3.3V$, $V_{cmax} = V_{emax} \sim = 10V$, with $T_{prog} = T_{erase} \sim = 20\text{-}50$ milliseconds. For gate oxide thickness of 120 Å, $V_{N1} \sim = 5.0V$, $V_{cmax} = V_{emax} \sim = 16V$, with $T_{prog} = T_{erase} \sim = 20\text{=}50$ milliseconds. Supply voltage level $V_{N2}$ should be smaller than supply voltage level $V_{N1}$, the difference depending upon the process technology utilized.

It should be understood that the particular embodiments of the invention described above have been provided by way of example and that other modifications may occur to those skilled in the art without departing from the scope of the invention as expressed in the appended claims and their equivalents.

What is claimed is:

1. A non-volatile memory (NVM) cell structure comprising:
   an NMOS control transistor having commonly-connected source, drain and bulk region electrodes to which a control voltage is applied and a gate electrode connected to a data storage node;
   a PMOS erase transistor having commonly-connected source, drain and bulk region electrodes to which an erase voltage is applied and a gate electrode connected to the data storage node;
   a PMOS inverter transistor having a drain electrode connected to an output voltage node of the NVM cell;
   an NMOS inverter transistor having a drain electrode connected to the output voltage node;
   a first NMOS transistor that includes commonly-connected source and bulk region electrodes that are grounded, a drain electrode that is connected to the source of the PMOS inverter transistor, and a gate electrode connected to a first electrode;
   a first PMOS transistor having commonly-connected source and bulk region electrodes selectively connectable to receive the first supply voltage or the second supply voltage, a drain electrode that is connected to the source of the PMOS inverter transistor, and a gate electrode connected to the first electrode;
   a second NMOS transistor that includes commonly-connected source and bulk region electrodes that are grounded, a drain electrode that is connected to the source electrode of the NMOS inverter transistor; and a gate electrode connected to a second electrode; and
   a second PMOS transistor having commonly-connected source and bulk region electrodes selectively connectable to receive either the first supply voltage or the second supply voltage, a drain electrode connected to the source electrode of the NMOS inverter transistor, and a gate electrode connected to the second electrode.

2. A non-volatile memory (NVM) cell array row that includes a plurality of NVM cells, each NVM cell in the array row comprising:
   an NMOS control transistor having commonly-connected source, drain and bulk region electrodes to which a control voltage is applied and a gate electrode connected to a data storage node;
   a PMOS erase transistor having commonly-connected source, drain and bulk region electrodes to which an erase voltage is applied and a gate electrode connected to the data storage node;
   a PMOS inverter transistor having a drain electrode connected to an output voltage node of the NVM cell;
   an NMOS inverter transistor having a drain electrode connected to the output voltage node;
   a first NMOS transistor that includes commonly-connected source and bulk region electrodes that are grounded, a drain electrode that is connected to the source of the PMOS inverter transistor, and a gate electrode connected to a first electrode;
   a first PMOS transistor having commonly-connected source and bulk region electrodes selectively connectable to receive the first supply voltage or the second supply voltage, a drain electrode that is connected to the source of the PMOS inverter transistor, and a gate electrode connected to the first electrode;
   a second NMOS transistor that includes commonly-connected source and bulk region electrodes that are grounded, a drain electrode that is connected to the source electrode of the NMOS inverter transistor; and a gate electrode connected to a second electrode; and
   a second PMOS transistor having commonly-connected source and bulk region electrodes selectively connectable to receive either the first supply voltage or the second supply voltage, a drain electrode connected to the source electrode of the NMOS inverter transistor, and a gate electrode connected to the second electrode.

3. A method of reading data from a non-volatile memory (NVM) cell wherein the NVM cell includes an NMOS control transistor having commonly-connected source, drain and bulk region electrodes to which a control voltage is applied and a gate electrode connected to a data storage node; a PMOS erase transistor having commonly-connected source, drain and bulk region electrodes to which an erase voltage is applied and a gate electrode connected to the data storage node; a PMOS inverter transistor having a drain electrode connected to an output voltage node of the NVM cell; an NMOS inverter transistor having a drain electrode connected to the output voltage node; a first NMOS transistor that includes commonly-connected source and bulk region electrodes that are grounded, a drain electrode that is connected to the source of the PMOS inverter transistor, and a gate electrode connected to a first electrode; a first PMOS transistor having commonly-connected source and bulk region electrodes selectively connectable to receive the first supply voltage or the second supply voltage, a drain electrode that is connected to the source of the PMOS inverter transistor, and a gate electrode connected to the first electrode; a second NMOS transistor that includes commonly-connected source and bulk region electrodes that are grounded, a drain electrode that is connected to the source electrode of the NMOS inverter transistor; and a gate electrode connected to a second electrode; and a second PMOS transistor having commonly-connected source and bulk region electrodes selectively connectable to receive either the first supply voltage or the second supply voltage, a drain electrode connected to the source electrode of the NMOS inverter transistor, and a gate electrode connected to the second electrode, a method comprising:

setting the first electrode to the 0V, thereby setting the source electrode of the PMOS inverter transistor to the second supply voltage;

setting the second electrode to the second supply voltage, thereby setting the source of the NMOS inverter transistor to 0V;

setting all other electrodes of the NVM cell to 0V, whereby output data of the NVM cell is available on the output voltage node.

\* \* \* \* \*